(12) United States Patent
Smith

(10) Patent No.: US 6,584,584 B1
(45) Date of Patent: Jun. 24, 2003

(54) METHOD AND APPARATUS FOR DETECTING ERRORS IN A FIRST-IN-FIRST-OUT BUFFER

(75) Inventor: Brian L. Smith, Sunnyvale, CA (US)

(73) Assignee: OpenTV, Inc., San Francisco, CA (US)

( * ) Notice: Subject to any disclaimer, the term of this patent is extended or adjusted under 35 U.S.C. 154(b) by 0 days.

(21) Appl. No.: 09/546,073

(22) Filed: Apr. 10, 2000

(51) Int. Cl.$^7$ .................................................. G06F 11/00
(52) U.S. Cl. .......................................... 714/42; 714/807
(58) Field of Search .............................. 714/54, 42, 40, 714/49, 53, 807; 711/133, 156

(56) References Cited

U.S. PATENT DOCUMENTS

| | | | | |
|---|---|---|---|---|
| 5,469,443 A | * | 11/1995 | Saxena | 714/720 |
| 5,469,449 A | | 11/1995 | Park | |
| 5,469,558 A | | 11/1995 | Lieberman et al. | |
| 5,473,756 A | | 12/1995 | Traylor | |
| 5,513,318 A | * | 4/1996 | van de Goor et al. | 714/48 |
| 5,594,743 A | | 1/1997 | Park | |
| 5,813,040 A | * | 9/1998 | Rathke | 711/156 |
| 5,978,935 A | * | 11/1999 | Kim et al. | 714/42 |
| 6,088,817 A | * | 7/2000 | Haulin | 714/42 |
| 6,108,802 A | * | 8/2000 | Kim et al. | 714/718 |
| 6,145,055 A | * | 11/2000 | Fujimoto | 711/128 |
| 6,360,219 B1 | * | 3/2002 | Bretl et al. | 707/8 |
| 6,442,657 B1 | * | 8/2002 | Fan et al. | 711/156 |
| 6,457,067 B1 | * | 9/2002 | Byers et al. | 710/3 |
| 6,480,942 B1 | * | 11/2002 | Hirairi | 711/156 |

* cited by examiner

Primary Examiner—Robert Beausoliel
Assistant Examiner—Gabriel Chu
(74) Attorney, Agent, or Firm—Meyertons, Hood, Kivlin, Kowert & Goetzel, PC; Rory D. Rankin; Lawrence J. Merkel

(57) ABSTRACT

A method and apparatus for detecting errors in a First-In-First-Out buffer (FIFO). A FIFO includes verification bits associated with data entries. In addition, the FIFO includes an expected value bit for comparison on reads. Upon reset, the verification bits are initialized to an alternating sequence of binary values and the expected value bit is initialized to a predetermined binary value. On a write to a FIFO entry, the corresponding verification bit is toggled. On a read from an entry, the corresponding verification bit is compared to the expected value. If the verification bit does not match the expected value, an error is detected.

13 Claims, 6 Drawing Sheets

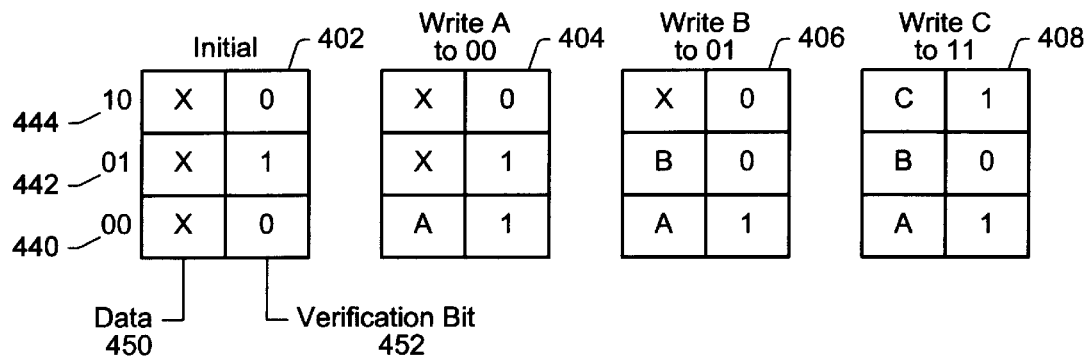
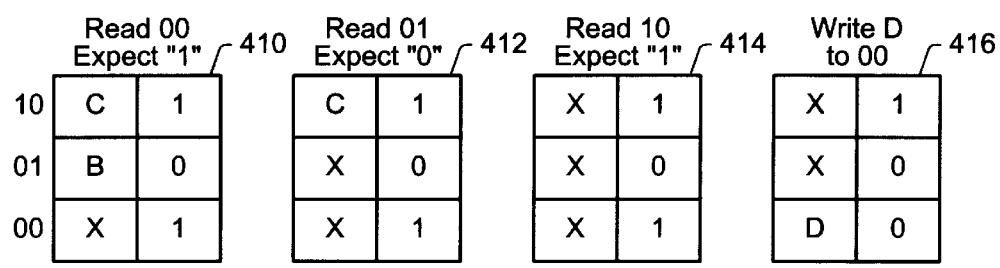
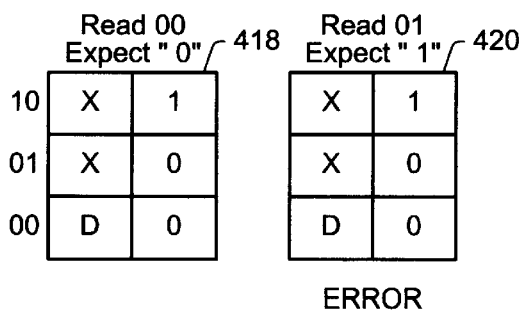
Fig. 4

METHOD AND APPARATUS FOR DETECTING ERRORS IN A FIRST-IN-FIRST-OUT BUFFER

BACKGROUND OF THE INVENTION

1. Field of the Invention

This invention is related to the field of digital communications and, more particularly, to error detection in a First-In-First-Out (FIFO) buffer.

2. Description of the Related Art

Digital electronics frequently require the communication of data between systems (or components thereof) of varying clock frequencies. In such a case, one system may have the ability to transmit data at a faster rate than another system is capable of receiving and processing. Also, various components may have clocks which originate from different sources or clock domains. Such clock signals may have the same frequencies, but have phase differences. In order to compensate for a disparity in transmission rates between sender and receiver, First-In-First-Out (FIFO) buffers are frequently used. A FIFO is a memory buffer which may store data and returns that stored data in the same order in which it was received. A FIFO typically comprises a fixed number of memory storage locations and circuitry for selecting read and write locations. By storing received data in a FIFO, a slower system may receive data at a rate which is higher than the rate at which it can process data, or data may be synchronized between different clock domains.

As is well known, because spikes, transients, glitches and other noise may exist within an electrical system, circuitry which reads from and writes to a FIFO may operate incorrectly. Consequently, a write to a full FIFO or a read from an empty FIFO may occur. Alternately, data may be read from or written to a wrong location in a FIFO. As a result, data which is assumed to be correct, but is actually erroneous, may be read from the FIFO.

SUMMARY OF THE INVENTION

The problems outlined above are in large part solved by a FIFO and method as described herein. Additional circuitry is included which enables a read from a FIFO to compare a value stored with the data to an expected value. When a mismatch between the stored value and expected value occurs, an error is detected. Advantageously, greater confidence may be had in the data which is read from a FIFO and the incidence of the transmission of erroneous data may be reduced.

Broadly speaking, a FIFO is contemplated. The FIFO includes a number of locations for storing data, each having an associated verification bit. Upon initialization, the verification bits are set to an alternating sequence of binary values. Also included is write circuitry which may write data to an entry of the FIFO. When data is written to an entry in the FIFO, the verification bit associated with that entry is toggled.

Also contemplated is a method. The method includes initializing a number of verification bits to an alternating sequence of binary values, where each verification bit corresponds to a storage location in a FIFO. Data may be written to a storage location of the FIFO and the corresponding verification bit toggled in response to that write.

Also contemplated is a FIFO which includes a number of verification bits and read circuitry. Each of the verification bits corresponds to a storage location. The read circuitry may read data from a storage location and the verification bit which corresponds to that storage location. The read circuitry includes an expected value bit which is compared to the verification bit on reads of data from the FIFO. Based on this comparison, errors may be detected. In addition, the expected value bit is toggled in response to reads. Though in the case where the FIFO has an even number of locations and it is the last entry which is read from the FIFO, the expected value is not toggled.

Finally, a method of error detection in a FIFO is contemplated. The method includes reading data and a corresponding verification bit from the FIFO, detecting an error in the FIFO by comparing the verification bit to an expected value bit, and toggling the expected value bit in response to a read and a first condition.

BRIEF DESCRIPTION OF THE DRAWINGS

Other objects and advantages of the invention will become apparent upon reading the following detailed description and upon reference to the accompanying drawings in which:

FIG. 4 illustrates the operation of a FIFO of odd depth.

Figure 1:
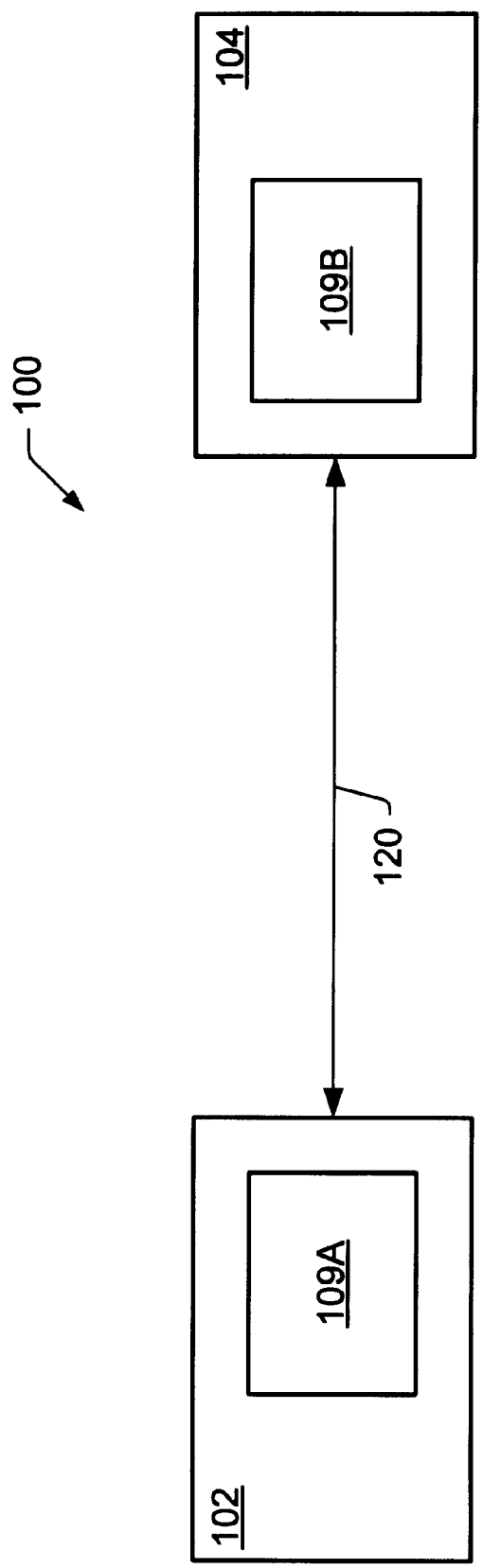
FIG. 1 is a block diagram of one embodiment of a system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

System Overview

Turning now to FIG. 1, a block diagram of one embodiment of a system 100 is shown. Other embodiments are possible and contemplated. As shown in FIG. 1, system 100 includes nodes 102 and 104, and interconnect 120. Each of nodes 102 and 104 includes a FIFO 109A–109B. Node 102 is coupled to node 104 via interconnect 120. Elements referred to herein with a particular reference number followed by a letter will be collectively referred to by the reference number alone. For example, FIFOs 109A–109B will be collectively referred to as FIFOs 109.

In FIG. 1, system 100 may represent any of a multitude of possible systems or devices. For example, system 100 may represent the interconnection of two components, 102 and 104, within a computer processor. Alternately, system 100 may represent the interconnection of two components, 102 and 104, in a computer system. Further, system 100 may represent the interconnection of two computer workstations 102 and 104 in a computer network. Many possible configurations exists. However, in each case, one node is configured to send data to the other node, which is configured to receive it. In one embodiment, node 102 is configured to send data to node 104. Node 104 receives data transmitted from node 102 into a FIFO 109B. Node 104 may then process data received from node 102 by retrieving it from FIFO 109B. In addition, node 104 may be configured to send data to node 104 which may receive it in FIFO 109A. Advantageously, if the rate at which node 102 sends data is greater than the rate at which node 104 can process data, FIFO 109B may serve as a buffer which permits node 102 to continue to send data at a higher rate and node 104 to process the received data at a slower rate. Alternatively, if nodes 102 and 104 operate at the same rate, but have different clock domains, FIFOs 109A and 109B may be used to compensate for phase differences between their respective clocks when transmitting or receiving data. Further, if nodes 102 and 104 have asynchronous clocks, FIFOs 109A and 109B may be used to compensate for their asynchronous nature.

Error Detecting FIFO

As is well known in the electrical arts, electrical circuits are susceptible to glitches, spikes, transients and various other types of noise which may interfere with correct operation. In order to enhance the reliability of transmitted data, a mechanism may be used which enables a FIFO to detect when an error has occurred. A verification bit is associated with each data entry of the FIFO. Also, an expected value bit is maintained by a read control circuit. When the read control circuit reads data from the FIFO, it compares the associated verification bit to its expected value bit. When a mismatch between the verification and expected value bits occurs, an error has been detected and the FIFO may be reset.

Figure 2:
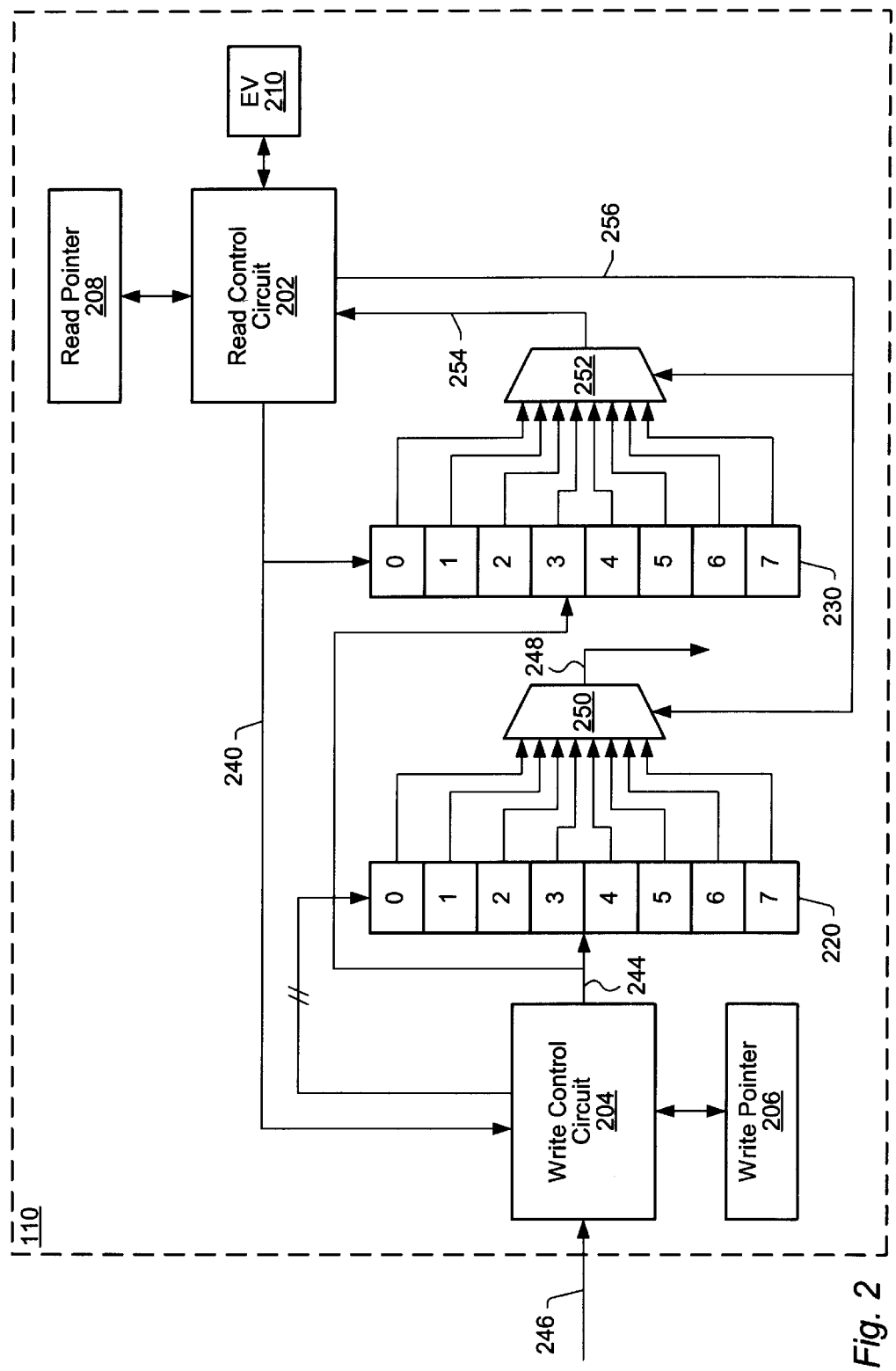
FIG. 2 is a diagram of one embodiment of a FIFO.

FIG. 2 is a diagram illustrating one embodiment of a FIFO 110 which includes an error detection mechanism. FIG. 2 includes write control circuit 204, read control circuit 202, data storage 220, verification bit storage 230, expected value (EV) bit 210, write pointer 206 and read pointer 208. Also included are multiplexors 250 and 252. Write pointer 206 is coupled to write control circuit 204. Read pointer 208 and expected value bit 210 are coupled to read control circuit 202. In addition, read control circuit 202 is coupled to multiplexors 250 and 252 via signal 256, as well as write control circuit 204 via signal 240. Write control circuit 204 is further coupled to data storage 220 and verification bit storage 230 via bus 244. Finally, in one embodiment, write control circuit 204 may be coupled to receive write data upon bus 246.

In FIG. 2, data storage 220 and verification bit storage 230 are configured to hold eight entries, 0–7. In one embodiment, locations 0–7 in data storage 220 may each store one or more bits of data. Also, in one embodiment, verification bit storage 230 may include a plurality of toggle flip-flops which may be reset to a predetermined value. Entry 0 in data storage 220 and verification storage 230 may be configured to be the first entry and entry 7 the last entry. In addition, expected value 210 may comprise a toggle flip flop which may be reset to a predetermined value.

General FIFO Operation

Prior to a first entry being written to data storage 220, a reset of the FIFO 110 is done. Upon reset, read control circuit 202 causes expected value 210 to assume the binary value "1" and causes read pointer 208 to point to entry 0 in data storage 220 and verification bit storage 230. In addition, read control circuit 202 conveys a reset signal 240 to write control circuit 204 and verification bit storage 230. Upon receiving reset signal 240, write control circuit 204 causes write pointer 206 to point to entry 0 in data storage 220 and verification bit storage 230. Reset signal 240 also causes the value of the bits in verification storage 230 to assume an alternating sequence of binary values with entry 0 containing the binary value "0", entry 1 containing the binary value "1", entry 2 containing the binary value "0", and so on.

In response to receiving data upon bus 246, write control circuit 204 stores the received data in the data storage 220 entry pointed to by write pointer 206. In addition, write control circuit 204 conveys a signal to the verification storage 230 entry pointed to by write pointer 206 which causes the binary contents of that entry to be complemented. Write control circuit 204 then increments the contents of write pointer 206 to point to the next entry in data storage 220 and verification bit storage 230. Subsequent writes operate similarly, complementing the associated verification bit 230 and incrementing the write pointer 206. When the write pointer reaches the last entry, 7, in data storage 220, its next incremented value is the first entry, 0. In this manner, the write pointer "wraps" around data storage 220 and verification bit storage 230.

When a read of data storage is done, read control circuit 202 uses the contents of read pointer 208 to select values for output from multiplexors 250 and 252. Select signal 256 selects a stored data item from multiplexor 250 which is conveyed upon bus 248, and a verification bit from multiplexor 252 which is conveyed on bus 254 to read control circuit 202. The conveyed verification bit corresponds to the conveyed data item from data storage 220. Read control circuit then compares the received verification bit to expected value 210. If the received verification bit does not match the expected value 210, an error has been detected and the FIFO may be reset as described above. If the received verification bit matches the expected value 210, no error is detected and read pointer 208 is incremented. Because writes to FIFO locations always complement the corresponding verification bit, comparison of the verification bit to the expected value may indicate that valid data is present. Consequently, reads of data from the FIFO may be held off until valid data is indicated by the corresponding verification bit. Read pointer 208 also "wraps" around as described above in the discussion of the write pointer 206. In addition, expected value 210 is complemented in response to a read. There is one exception in which expected value 210 will not be complemented as just described. When the number of locations in the FIFO data storage 220 is an even number and read pointer 208 has just been incremented such that it has wrapped around to entry 0, the expected value 210 is not complemented. The expected value 210 is not complemented, in this case, because the alternating sequence of values in an even numbered FIFO leaves the first and last entry with the same value. When the verification bits in verification storage 230 are initialized, the value in the first entry may either be a binary "0" or "1". Likewise, when expected value 210 is initialized its value may be "0" or "1". In one embodiment, the initial expected value 210 matches the initial value of the verification bit in the first entry of verification bit storage 230. The following flowchart illustrates the general flow of operation of FIFO 110.

As indicated above, each time a write to a location in FIFO 110 occurs the value of the corresponding verification bit is changed. Consequently, when reading from a location in FIFO 110, read control circuit 202 may detect whether new data has been written to the location by comparing the expected value 210 to the verification bit corresponding to the location which is read. Further, because an alternating sequence of values are used in verification bit storage 230, read control circuit 202 may detect an out of sequence read by detecting two successive verification bits with the same value.

Flowchart of Operation

Figure 3:
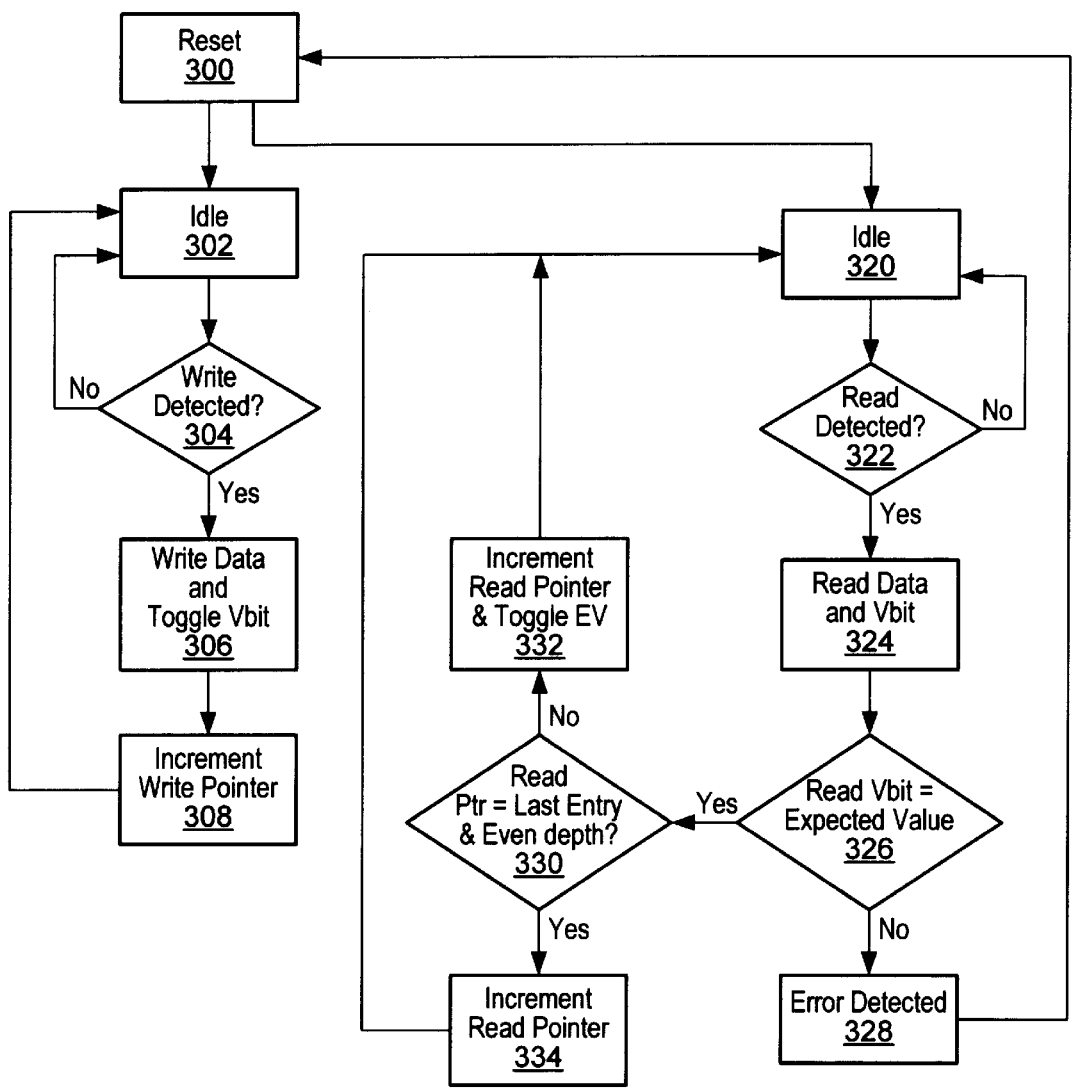
FIG. 3 is flowchart illustrating the operation of the FIFO of FIG. 2.

FIG. 3 is a flowchart illustrating the operation of FIFO 110 including an error detection mechanism. Prior to a first entry, a reset (block 300) of the FIFO 110 is done to initialize the read 208 and write 206 pointers, verification bits 230, and expected value 210. The flowchart in FIG. 3, represents a dual ported FIFO 110 in which read and write operations may be concurrent. Subsequent to reset 300, the FIFO 110 waits for either a read or a write operation. Write control circuit 204 remains in an idle state (block 302) and read control circuit 202 remains in an idle state (block 320). If a write is detected (decision block 304), write control circuit 204 writes data to FIFO data storage 220 and toggles the associated verification bit (block 306). Write control circuit 204 then increments the write pointer 206 (block 308) and returns to idle state 302. When a read is detected (decision block 322), read circuit reads data from data storage 220 and the corresponding verification bit from verification bit storage 230 (block 324) indicated by the read pointer 208. If the read verification bit does not equal expected value 210 (decision block 326) an error is detected (block 328) and the FIFO 110 is reset (block 300). On the other hand, if the read verification bit does equal expected value 210 (decision block 326), flow continues to decision block 330. If the FIFO has an even number of locations and the read pointer 208 currently points to the last location in the FIFO 110, then the read pointer 208 is incremented (block 334) and flow continues to the idle state (block 320). If the FIFO has an odd number of locations or the read pointer 208 does not currently point to the last entry in the FIFO 110, then the read pointer 208 is incremented, the expected value 210 is toggled (block 332), and flow continues to the idle state (block 320). In one embodiment, when an error is detected an error signal may be conveyed to other parts of the system for other error handling procedures. Additionally, in one embodiment, upon detecting an error a reset may not be done and an error handling procedure performed by another part of the system. The following discussion illustrates a number of examples of the operation of FIFO 110.

Underflow Detection

FIG. 4 illustrates the operation of a reset, writes, reads, and an error due to an "underflow". An underflow represents an error condition in which a read of an empty FIFO occurs. FIG. 4 illustrates a FIFO with a depth of three and shows a data contents 450 and associated verification bit contents 452. The contents of the FIFO are shown at ten different times, 402–420, with 402 being the earliest and 420 being the latest. The first entry in the FIFO 110 is represented by 440, the second by 442, and the third by 444. The FIFO 110 contents at time 402 represents the state of the FIFO 110 just after reset. Note the alternating sequence of binary values of verification bits 452, with the first entry 440 represented by a binary "0". At time 404, a write of a data "A" to entry 440 has occurred. Concurrent with a write of the data, the value of the verification bit 452 corresponding to entry 440 has been complemented from "0" to "1". At time 406, a write of data "B" to entry 442 has occurred and the corresponding verification bit 452 has been complemented from "1" to "0". At time 408, a write of data "C" to entry 444 and a complement of the corresponding verification bit 452 has occurred. At time 410, a read of entry 440 has occurred. The read circuit 202 was expecting a value of "1" for the corresponding verification bit 452, which it is, and no error is detected. Consequently, the expected value 210 is complemented to "0". At time 412, a read of entry 442 has occurred and the verification bit 452 matches the expected value of "0". The expected value 210 is now complemented to the value "1". At time 414 a read of entry 444 has occurred, the verification bit 452 matches the expected value 210, and the expected value is complemented. At time 416, a write of data "D" to entry 440 has occurred and the verification bit of entry 440 has been complemented. At time 418, a read of entry 440 has occurred and the verification bit 452 matches the expected value 210. Consequently, the expected value is complemented to the value "1". Finally, in time 420, a read of the next entry, 442, is done. However, in this case the verification bit 452 does not match the expected value 210 and an error is detected. Because no current write to the FIFO entry 442 has occurred, the corresponding verification bit has not been complemented and a mismatch between the expected value and verification bit has occurred on a read. Advantageously, an underflow error condition has been detected. Note that with an odd depth FIFO as described in FIG. 4, the expected value 210 is always complemented on a read.

Overflow Detection

Figure 5:
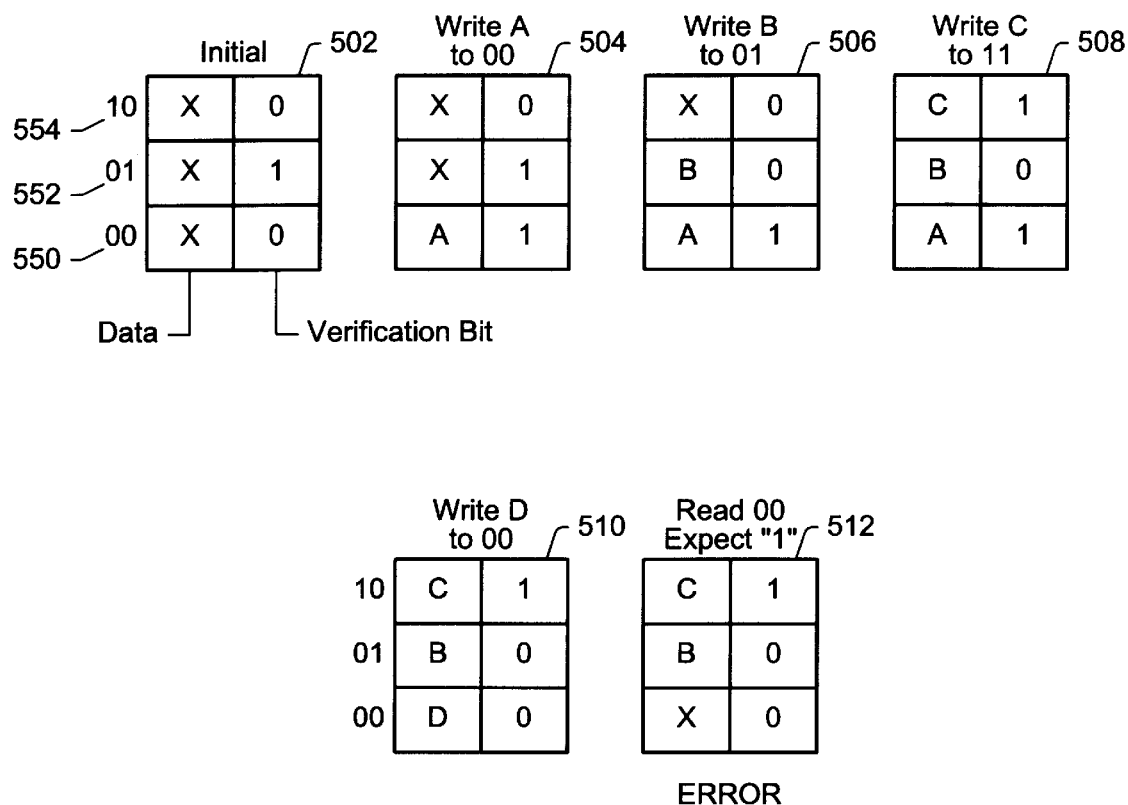
FIG. 5 illustrates error detection in the FIFO of FIG. 4.

FIG. 5 illustrates the detection of an overflow error condition in FIFO 110. An overflow results from writing to a FIFO which is already full. The contents of FIFO 110 are shown at six different times, 502–512, with 502 being the earliest and 512 being the latest. The first entry is 550, the second entry is 552, and the third 554. The contents of FIFO 502 represent its state after a reset and initialization of verification bits 502. At time 504, a write of data "A" to entry 550 has occurred. At time 506, a write of data "B" has occurred. At time 508, a write of data "C" has occurred. Concurrent with each write, the corresponding verification bit is complemented as described above. Following the write at time 508, FIFO 110 is full and has no further locations available. However, at time 510, a write of data "D" to entry 550 occurs. A write to a full FIFO is an overflow error condition. At time 512, a read of entry 550 occurs. However, because read circuit 202 expects a value of "1" and the verification bit 552 is a "0", an error is detected. Advantageously, the overflow error condition is detected.

Figure 6:
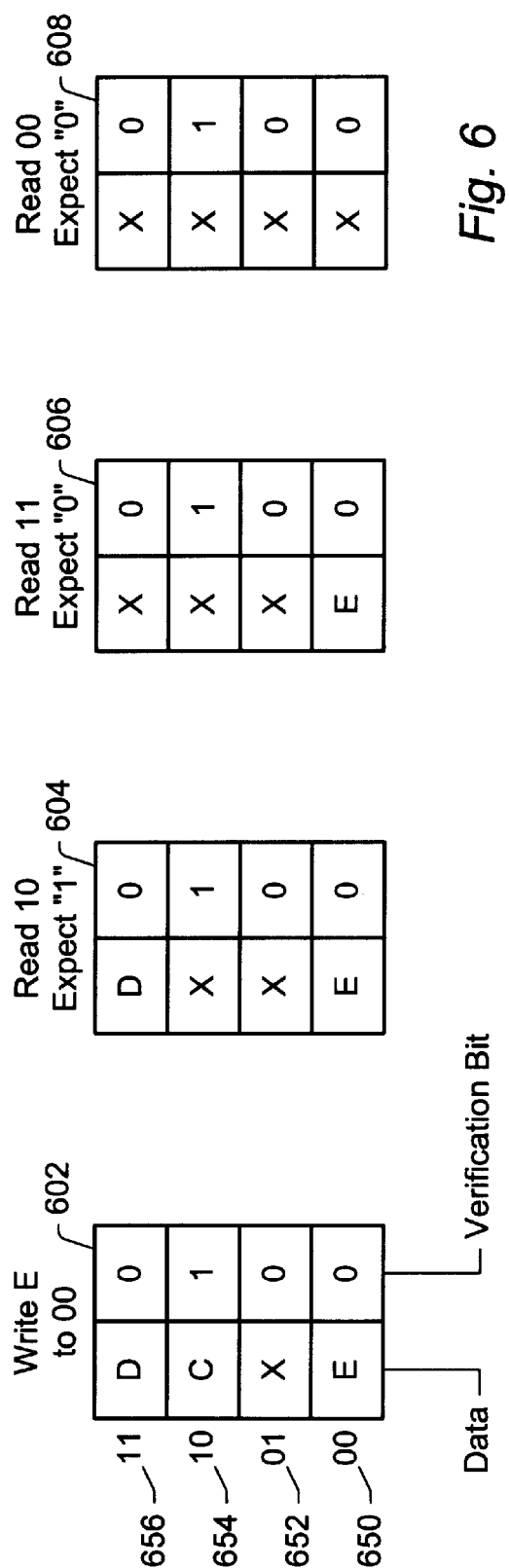
FIG. 6 illustrates the operation of a FIFO of even depth.

Turning now to FIG. 6, an illustration of an even depth FIFO is shown. When an even depth FIFO is used, complementing of the expected value 210 has one exception. When incrementing the read pointer 208 to wrap around to the first entry, the expected value 210 is not complemented. FIG. 6 shows a four entry FIFO 110, 650–656, at four times, 602–608, with 602 being the earliest and 608 being the latest. At time 602, a write of data "E" to entry 650 has occurred. At time 604, a read of entry 654 has occurred with an expected value 210 of "1" and the expected value is complemented to "0". At time 606, a read of entry 656 has occurred with an expected value of "0". In this case, because the read pointer 208 currently points to the last entry in FIFO 110 and the FIFO 110 has an even depth, the expected value is not complemented, but remains "0". Finally, at time 608 a read of entry 650 has occurred with an expected value of "0". Advantageously, expected values and verification bits remain in sync and correct operation is maintained.

Numerous variations and modifications will become apparent to those skilled in the art once the above disclosure is fully appreciated. It is intended that the following claims be interpreted to embrace all such variations and modifications.

What is claimed is:

1. A First-In-First-Out buffer (FIFO) comprising:
   a plurality of storage locations, each of said locations corresponding to a single verification bit of a plurality of verification bits, wherein said plurality of verification bits are initialized to an alternating sequence of binary values;

a single expected value bit;
write circuitry configured to:
 write data to a first storage location of said plurality of storage locations; and
 toggle a first verification bit of said verification bits which corresponds to said first storage location in response to said write;
read circuitry configured to:
 read a second storage location of said locations;
 read a second verification bit of said verification bits which corresponds to said second storage location; and detect
 detect an error by comparing said second verification bit to said expected value bit.

2. The FIFO of claim 1, wherein said read circuitry is further configured to toggle said expected value bit in response to said read.

3. The FIFO of claim 2, wherein said read circuitry is configured to toggle said expected value bit in further response to detecting that a read pointer of said read circuitry does not point to a last storage location of said plurality of storage locations, wherein said plurality of storage locations comprise an even number of locations.

4. The FIFO of claim 3, wherein said expected value bit is initialized to a predetermined binary value.

5. The FIFO of claim 4, wherein said FIFO includes a read pointer and a write pointer, wherein said read pointer and said write pointer are initialized to point to a first entry in said FIFO in response to detecting a reset.

6. The FIFO of claim 1, further comprising a write pointer and a read pointer, wherein said write circuitry is further configured to increment said write pointer in response to said write, and wherein said read pointer is further configured to increment said read pointer in response to said read.

7. A method comprising:
 initializing a plurality of verification bits to a sequence of alternating binary values, wherein each of said plurality of verification bits corresponds to one of a plurality of storage locations in a First-In-First-Out buffer (FIFO);
 writing a first data to a first storage location of said plurality of storage locations;
 toggling a first verification bit of said plurality of verification bits in response to said writing, wherein said first verification bit corresponds to said first storage location;
 reading said first data from said first storage location;
 reading said first verification bit; and
 detecting an error by comparing said first verification bit to an expected value bit.

8. The method of claim 7, further comprising:
 reading a second data and a second verification bit from said FIFO, wherein said second verification bit corresponds to said second data; and
 detecting an error in said FIFO in response to comparing said second verification bit to said expected value bit.

9. The method of claim 8, further comprising toggling said expected value bit in response to said reading.

10. The method of claim 9, wherein said toggling is in further response to detecting that a read pointer of said FIFO does not point to a last storage location of said plurality of storage locations, wherein said plurality of storage locations comprise an even number of locations.

11. The method of claim 10, further comprising initializing said expected value bit to a predetermined binary value.

12. The method of claim 11, further comprising initializing a read pointer and a write pointer to point to a first entry of said FIFO, in response to detecting a reset.

13. The method of claim 7, further comprising:
 incrementing a write pointer responsive to said writing; and
 incrementing a read pointer responsive to said reading.

* * * * *

UNITED STATES PATENT AND TRADEMARK OFFICE
CERTIFICATE OF CORRECTION

PATENT NO. : 6,584,584 B1
DATED : June 24, 2003
INVENTOR(S) : Brian L. Smith

It is certified that error appears in the above-identified patent and that said Letters Patent is hereby corrected as shown below:

<u>Title page,</u>
Item [73], Assignee, should read -- Sun Microsystems, Inc., Palo Alto, CA --

Signed and Sealed this

Fourteenth Day of October, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,584,584 B1
DATED        : June 24, 2003
INVENTOR(S)  : Brian L. Smith It is certified that error appears in the above-identified patent and that said Letters Patent is hereby corrected as shown below:

Column 7,
Line 12, please delete "detect".

Signed and Sealed this

Twenty-second Day of November, 2005

JON W. DUDAS
*Director of the United States Patent and Trademark Office*